(12) United States Patent
Park et al.

(10) Patent No.: US 12,362,587 B2
(45) Date of Patent: Jul. 15, 2025

(54) ELECTRONIC DEVICE AND METHOD FOR MEASURING VOLTAGE OF BATTERY IN ELECTRONIC DEVICE

(71) Applicant: SAMSUNG ELECTRONICS CO., LTD., Suwon-si (KR)

(72) Inventors: Jongdo Park, Suwon-si (KR); Junghoon Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 20 days.

(21) Appl. No.: 18/100,364

(22) Filed: Jan. 23, 2023

(65) Prior Publication Data

US 2023/0238820 A1    Jul. 27, 2023

Related U.S. Application Data

(63) Continuation of application No. PCT/KR2021/009304, filed on Jul. 20, 2021.

(30) Foreign Application Priority Data

Jul. 24, 2020  (KR) .......................... 10-2020-0092186

(51) Int. Cl.
*H02J 7/00* (2006.01)
*G01R 31/36* (2020.01)
(Continued)

(52) U.S. Cl.
CPC ........ *H02J 7/007182* (2020.01); *G06F 1/266* (2013.01); *H02J 7/0048* (2020.01);
(Continued)

(58) Field of Classification Search
CPC . G06F 1/26; G06F 1/263; G06F 1/266; G01R 31/36; G01R 31/382; H02J 7/0048; H02J 7/007182
(Continued)

(56) References Cited

U.S. PATENT DOCUMENTS 5,514,946 A * 5/1996 Lin .......................... G06F 1/263
702/187
5,625,237 A   4/1997 Saeki et al.
(Continued)

FOREIGN PATENT DOCUMENTS

CN    206195856 U    5/2017
JP    08140289 A    5/1996
(Continued)

OTHER PUBLICATIONS

International Search Report and Written Opinion for International Application No. PCT/KR2021/009304; International Filing Date Jul. 20, 2021; Date of Mailing Oct. 26, 2021; 54 Pages.
(Continued)

*Primary Examiner* — Ji H Bae
(74) *Attorney, Agent, or Firm* — CANTOR COLBURN LLP

(57) ABSTRACT

An electronic device, according to various embodiments, comprises: a battery connecting circuit; a charging circuit for supplying power supplied from an external electronic device to a component and battery of the electronic device; and a processor. The processor may be configured to: in a first state in which the electronic device of which the battery is not connected to the battery connecting circuit receives power from the external electronic device, measure the voltage of the battery when it is confirmed that the battery is connected to the battery connecting circuit; and after confirming the capacity of the battery on the basis of the measured voltage, switch to a second state in which the charging circuit supplies power from the external electronic device to the battery connected to the battery connecting circuit. Various other embodiments may be provided.

10 Claims, 10 Drawing Sheets

(51) Int. Cl.
  *G01R 31/382* (2019.01)
  *G06F 1/26* (2006.01)

(52) U.S. Cl.
  CPC ............ *G01R 31/36* (2013.01); *G01R 31/382* (2019.01); *G06F 1/26* (2013.01); *G06F 1/263* (2013.01)

(58) Field of Classification Search
  USPC ................ 713/300, 310, 340; 320/132, 149; 702/63
  See application file for complete search history.

(56) References Cited

U.S. PATENT DOCUMENTS

| | | | |
|---|---|---|---|
| 5,754,868 A | | 5/1998 | Yamamoto et al. |
| 5,825,100 A | | 10/1998 | Kim |
| 6,366,054 B1 | | 4/2002 | Hoenig et al. |
| 10,361,577 B2 | * | 7/2019 | Gleason ............... H01M 10/486 |
| 2007/0005276 A1 | | 1/2007 | Cho et al. |
| 2008/0238207 A1 | * | 10/2008 | Kim ................... H01M 10/482 320/126 |
| 2009/0030626 A1 | * | 1/2009 | Iwane .................. G01R 31/367 702/63 |
| 2013/0285600 A1 | * | 10/2013 | Ishikawa .............. H01M 10/48 320/107 |
| 2013/0314047 A1 | * | 11/2013 | Eagle ................... G06F 1/3212 320/127 |
| 2014/0082394 A1 | | 3/2014 | Kitano et al. |
| 2014/0197780 A1 | * | 7/2014 | Imamura ................... H02J 7/00 320/107 |
| 2015/0048801 A1 | * | 2/2015 | Kessler .............. G01R 31/3842 324/426 |
| 2019/0149743 A1 | * | 5/2019 | Toyoda ................ H04N 23/667 348/372 |
| 2020/0139844 A1 | | 5/2020 | Gelso |

FOREIGN PATENT DOCUMENTS

| | | |
|---|---|---|
| JP | 2001186670 A | 7/2001 |
| JP | 2002238176 A | 8/2002 |
| JP | 2014059619 A | 4/2014 |
| KR | 0138350 B1 | 6/1998 |
| KR | 20050036658 A | 4/2005 |
| KR | 20060115012 A | 11/2006 |
| KR | 20060129962 A | 12/2006 |
| KR | 100963127 B1 | 6/2010 |
| KR | 20140067247 A | 6/2014 |
| KR | 101788647 B1 | 10/2017 |
| KR | 20180023412 A | 3/2018 |
| KR | 20180066762 A | 6/2018 |

OTHER PUBLICATIONS

Korean Office Action Issued in KR Application No. 10-2020-0092186; Mail Date Aug. 21, 2024; 15 Pages.
Written Decision on Registration Issued in KR Patent Application No. 10-2020-0092186, Mail Date Dec. 26, 2024, 2 Pages.

* cited by examiner

ELECTRONIC DEVICE AND METHOD FOR MEASURING VOLTAGE OF BATTERY IN ELECTRONIC DEVICE

CROSS-REFERENCE TO RELATED APPLICATION(S)

This application is a continuation application, claiming priority under § 365(c), of an International application No. PCT/KR2021/009304, filed on Jul. 20, 2021, which is based on and claims the benefit of a Korean patent application number 10-2020-0092186, filed on Jul. 24, 2020, in the Korean Intellectual Property Office, the disclosure of which is incorporated by reference herein in its entirety.

BACKGROUND

Various embodiments relate to an electronic device for measuring a voltage of a battery mounted in the electronic device, and a method for measuring a voltage of a battery in an electronic device.

While an electronic device is connected to an external charger and receives power, the electronic device may measure the capacity of the battery and display the same on a display of the electronic device, and may charge the battery while providing the battery with the power provided from the external charger.

While an electronic device in a state where no battery is mounted therein is connected to an external charger so as to receive power, if a removable battery is mounted in the electronic device, the battery may be connected to the electronic device so as to receive power from the external charger. The electronic device may measure a voltage of the battery connected to the electronic device, and may identify the current capacity of the battery, based on the measured voltage. However, when the battery is connected to the electronic device, due to a state of a load connected to the battery, for example, power consumption occurring from a component of the electronic device or power supplied from the external charger, the electronic device cannot accurately measure the voltage of the battery, so that the current capacity of the battery, in which an error has occurred, may be measured. If the voltage of the battery cannot be accurately measured, an error may occur in a charge control according to an inaccurate state of charge (SOC), and the capacity of the battery, in which the load state has suddenly changed, may appear to a user as an abrupt change.

Various embodiments relate to an electronic device for measuring a voltage of a battery mounted in the electronic device, and a method for measuring a voltage of a battery in an electronic device.

SUMMARY

An electronic device according to various embodiments may include a battery connection circuit, a charging circuit configured to supply power received from an external electronic device to a battery and a component of the electronic device, and a processor, wherein the processor is configured to, in a first state where the electronic device in which the battery is not connected to the battery connection circuit receives power from the external electronic device, measure a voltage of the battery if a connection of the battery to the battery connection circuit is established, and after a capacity of the battery is identified based on the measured voltage, perform switching to a second state where the charging circuit supplies power from the external electronic device to the battery connected to the battery connection circuit.

A method for measuring a voltage of a battery in an electronic device according to various embodiments may include, in a first state where an electronic device in which a battery is not connected to a battery connection circuit receives power from an external electronic device, identifying a connection of the battery to the battery connection circuit, measuring a voltage of the battery if the connection of the battery is identified, identifying a capacity of the battery, based on the measured voltage, and if the capacity of the battery is identified, performing switching to a second state where a charging circuit configured to supply power received from the external electronic device to the battery and a component of the electronic device supplies the power from the external electronic device to the battery connected to the control connection circuit.

An electronic device according to various embodiments may include a battery connection circuit, a charging circuit configured to supply power received from an external electronic device to a battery and a component of the electronic device, a switch configured to determine an open state or a closed state for an electrical path between the charging circuit and the battery connection circuit, and a processor, wherein the processor is configured to determine the switch to be in the open state, identify a connection of the battery to the battery connection circuit, measure a voltage of the battery if the connection of the battery is identified, and control the switch to be in the closed state.

ADVANTAGEOUS EFFECTS

According to various embodiments, when a battery is mounted while an electronic device is receiving power from an external charger, the electronic device is not affected by a state of a load connected to the battery, for example, power consumption occurring from a component of the electronic device or power supplied from the external charger, and accurately measures a voltage of the battery, so that the electronic device can provide the capacity of the battery to a user without an error.

DETAILED DESCRIPTION

Figure 1:
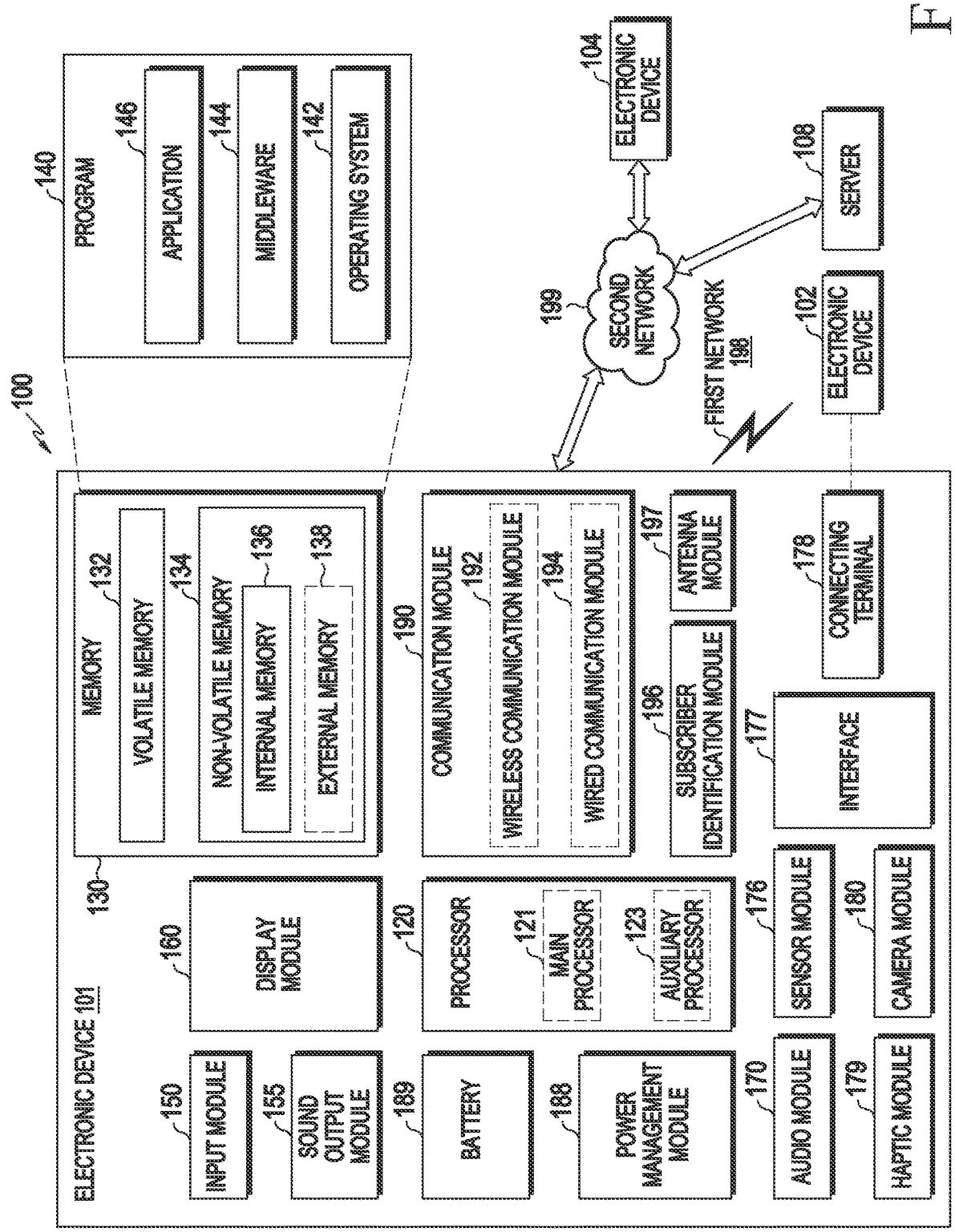
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
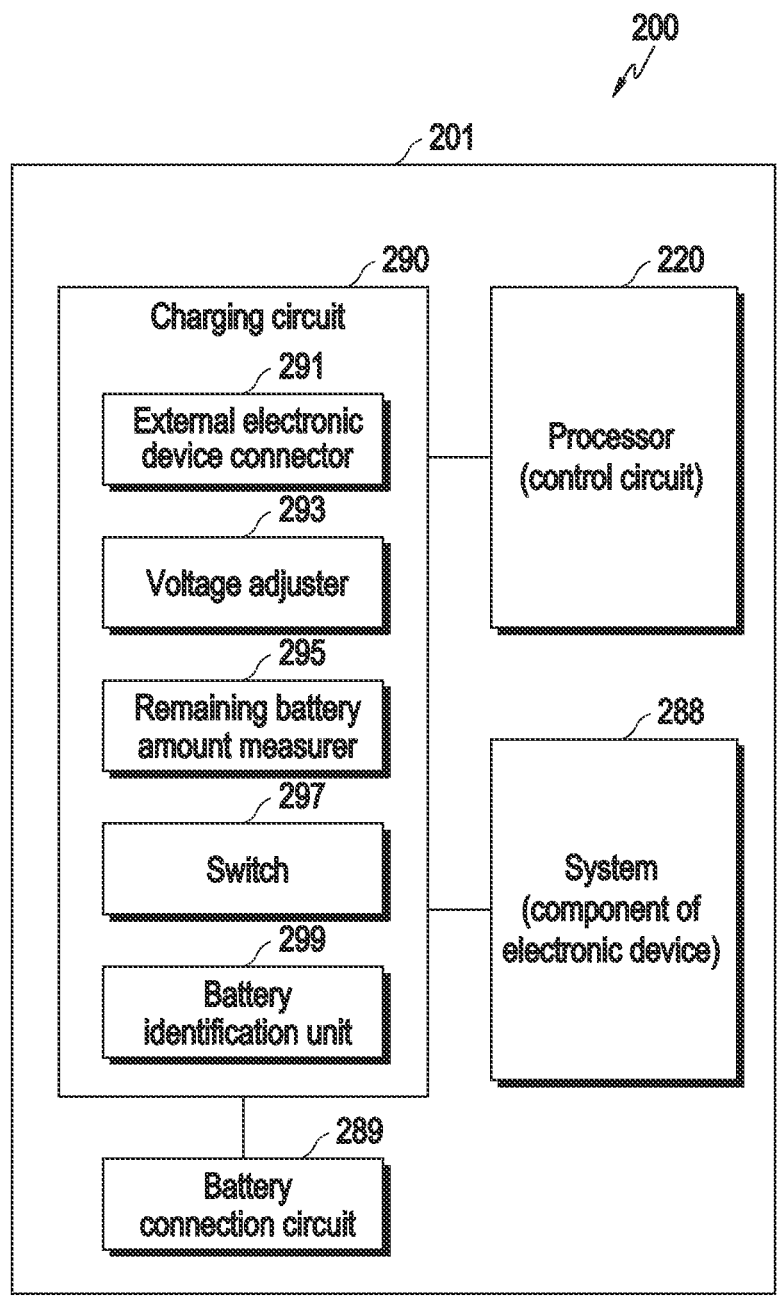
FIG. 2 is a block diagram of an electronic device according to various embodiments.

FIG. 2 is a block diagram 200 of an electronic device according to various embodiments.

Referring to FIG. 2, an electronic device 201 (e.g., the electronic device 101 of FIG. 1) may include a processor 220, a system 288 of the electronic device, a battery connection circuit 289, and a charging circuit 290.

According to various embodiments, the processor 220 may be a control circuit which may control the charging circuit 290. The processor 220 may be included in the charging circuit 290 or may be configured separately.

According to various embodiments, the processor 220 may be the same as the processor 120 of FIG. 1, which may control the overall operations of the electronic device 201 while controlling the charging circuit 290, or may perform at least one function or operation performed by the processor 120.

According to various embodiments, the processor 220 and the charging circuit 290, or the charging circuit 290 may be implemented substantially the same as or similar to the power management module 188 of FIG. 1.

According to various embodiments, the processor 220 may, in a first state where the electronic device 201, to which no battery is connected, is connected to an external electronic device (e.g., an external charger) and power from the external electronic device is supplied to the system 288 (a component of the electronic device) of the electronic device, if a connection of the battery to the battery connection circuit 289 is identified, measure a voltage of the battery, and after the voltage or the capacity of the battery is identified based on the measured voltage, perform switching to a second state where the charging circuit 290 supplies power from the external electronic device to the battery connected to the battery connection circuit 289.

According to an embodiment, the first state is a state in which the charging circuit 290 supplies power from the external electronic device to the system 288 (e.g., a component of the electronic device) of the electronic device in a state where a removable battery is not connected to the battery connection circuit 289 of the electronic device 201.

According to an embodiment, the second state may indicate a state in which the charging circuit 290 supplies power from the external electronic device to the system 288 (e.g., a component of the electronic device) of the electronic device and the battery connected to the battery connect circuit 289 in a state where the removable battery is connected to the battery connection circuit 289 of the electronic device 201.

According to an embodiment, in the first state, the processor 220 may control a switch 297 of the charging circuit 290, which may provide power from the external electronic device to the battery, to be in the open state to prevent switching of the second state in which power from the external electronic device is supplied to the battery when the battery is connected to the battery connection circuit 289.

According to an embodiment, in the first state, when a connection of the battery to the battery connection circuit 289 is identified, the processor 220 may control the switch 297 of the charging circuit 290, which may provide power from the external electronic device to the battery, to be in the open state to prevent switching of the second state in which power from the external electronic device is supplied to the battery that is connected to the battery connection circuit 289.

According to an embodiment, in the first state, when the connection of the battery to the battery connection circuit 289 is identified, the processor 220 may control a remaining battery amount measurer 295 of the charging circuit 290 to measure a voltage of the battery and may identify, based on the measured voltage, the voltage or the capacity of the battery. When the battery voltage or the capacity of the battery is identified, the processor 220 may control the switch 297 of the charging circuit 290 to be in the closed state to perform switching to the second state in which power from the external electronic device is supplied to the battery connected to the battery connection circuit 289 and the system 288 (a component of the electronic device) of the electronic device.

According to an embodiment, when the battery is connected to the battery connection circuit 289 in the first state, the processor 220 may measure a voltage of the battery, and if the measured voltage is equal to or lower than a first threshold value for determination of a low voltage, the processor 220 may control the switch 297 of the charging circuit 290 to be in the closed state to perform switching to a third state in which power from the external electronic device is supplied to the battery connected to the battery connection circuit 289. If the voltage of the battery connected to the battery connection circuit 289 is determined to be a low voltage, the processor 220 may display a UI, which indicates that the battery is in a low voltage state, via a display (not shown) in the third state.

According to an embodiment, if the voltage of the battery connected to the battery connection circuit 289 is determined to be a low voltage, the processor 220 may turn off the power from the electronic device and then perform switching to the third state.

For example, if the battery outputs a range of about 3.4V to 4.4V, outputs a voltage of about 4.4V when fully charged, and outputs a voltage of about 3.4V when fully discharged, the first threshold value may be about 3.4V.

According to an embodiment, when the battery is connected to the battery connection circuit 289 in the first state, the processor 220 may measure a voltage of the battery, and if the measured voltage is equal to or higher than the first threshold value for determination of a low voltage, the processor 220 may compare the measured voltage with a second threshold value for determination of an abnormal battery. When the voltage of the battery is identified to be equal to or higher than the second threshold value, the processor 220 may maintain the open state of the switch 297 of the charging circuit 290 for connecting the battery and the electronic device, and may display, via the display (not shown), a warning message informing about a connection of an abnormal battery.

For example, if the battery outputs a range of about 3.4V to 4.4V, outputs a voltage of about 4.4V when fully charged, and outputs a voltage of about 3.4V when fully discharged, the second threshold value may be about 4.5V.

According to various embodiments, the battery connection circuit 289, to which a removable battery is connected, includes at least one terminal connected to at least one terminal included in the battery, and may transmit voltage received from the battery via the at least one terminal to the charging circuit 290 of the electronic device 201.

According to various embodiments, the charging circuit 290 may supply, under the control of the processor 220, power from an external electronic device to the battery connected to the battery connection circuit 289 and/or the system 288 (a component of the electronic device) of the electronic device, and may include an external electronic device connector 291, a voltage adjuster 293, the remaining battery amount measurer 295, the switch 297, and a battery identification unit 299.

According to an embodiment, the charging circuit 290 may be implemented as at least a part of a power management integrated circuit (PMIC).

According to an embodiment, the external electronic device connector 291 may be connected to an external electronic device to receive power from the external electronic device, and may provide the received power from the external electronic device to the voltage adjuster 293.

According to an embodiment, the voltage adjuster 293 may adjust the voltage received from the external electronic device to a reference voltage configured for the electronic device. For example, the voltage adjuster 293 may adjust a voltage of 5V received from the external electronic device to 4V that is the reference voltage configured for the electronic device. When no battery is connected to the battery connection circuit 289, the voltage adjuster 293 may provide power from the external electronic device to the system 288 (a component of the electronic device) of the electronic device, and if the battery is connected to the battery connection circuit 289, power from the external electronic device may be provided to the battery and the system 288 (a component of the electronic device) of the electronic device.

According to an embodiment, the remaining battery amount measurer 295 may measure a voltage of the battery connected to the battery connection circuit 289, and may identify the voltage or the capacity of the battery, based on the measured voltage.

According to an embodiment, the remaining battery amount measurer 295 may measure a voltage of the battery connected to the battery connection circuit 289, a current flowing through the battery, an open circuit voltage (OCV), and/or a state of charge (SOC). The remaining battery amount measurer 295 may measure an open circuit voltage (OCV) of the battery connected to the battery connection circuit 289 and may calculate, based on the measured open circuit voltage, a state of charge (SOC) indicating an accurate capacity of the initial battery. A percentage (%) may be used as a unit relating to the state of charge (SOC) of the battery, and the capacity of the battery may be expressed as 0-100%. The state of charge (SOC) of the battery may be calculated via at least one of a voltage measurement method, a current integration method, and a pressure measurement method.

According to an embodiment, the remaining battery amount measurer 295 may include two sensing terminals (SN and SP) for sensing a voltage of the battery connected to the battery connection circuit 289.

According to an embodiment, the remaining battery amount measurer 295 may include a fuel gauge.

According to an embodiment, the switch 297 may supply power (voltage and current) of the external electronic device to the battery connected to the battery connection circuit 289.

According to an embodiment, the switch 297 may provide the voltage supplied from the external electronic device to the battery, by connecting the voltage adjuster 293 and the battery connected to the battery connection circuit 289.

According to an embodiment, in the first state where no battery is connected to the battery connection circuit 289, or when a connection of the battery is identified in the first state, the switch 297 may be controlled to be in the open state so that the battery connected to the battery connection circuit 289 is not directly connected to the voltage adjuster 293.

According to an embodiment, when the voltage or the capacity of the battery connected to the battery connection circuit 289 is identified, the switch 297 may be controlled to be in the closed state so that the battery connected to the battery connection circuit 289 is connected to the voltage adjuster 293.

According to an embodiment, a switch element included in the switch 297 may include a field effect transistor (FET).

According to an embodiment, the battery identification unit 299 may recognize a battery connected to the battery connection circuit 289.

According to an embodiment, the battery identification unit 299 is a terminal capable of recognizing a battery connected to the battery connection circuit 289, and may be connected to an identification terminal (e.g., an ID terminal) of the battery connected to the battery connection circuit 289.

According to an embodiment, the battery identification unit 299 may transmit a first signal (e.g., a high signal) to the processor 220 when no battery is connected to the battery connection circuit 289, and may transmit a second signal (e.g., a low signal) to the processor 220 when the battery is connected to the battery connection circuit 289.

Figure 3:
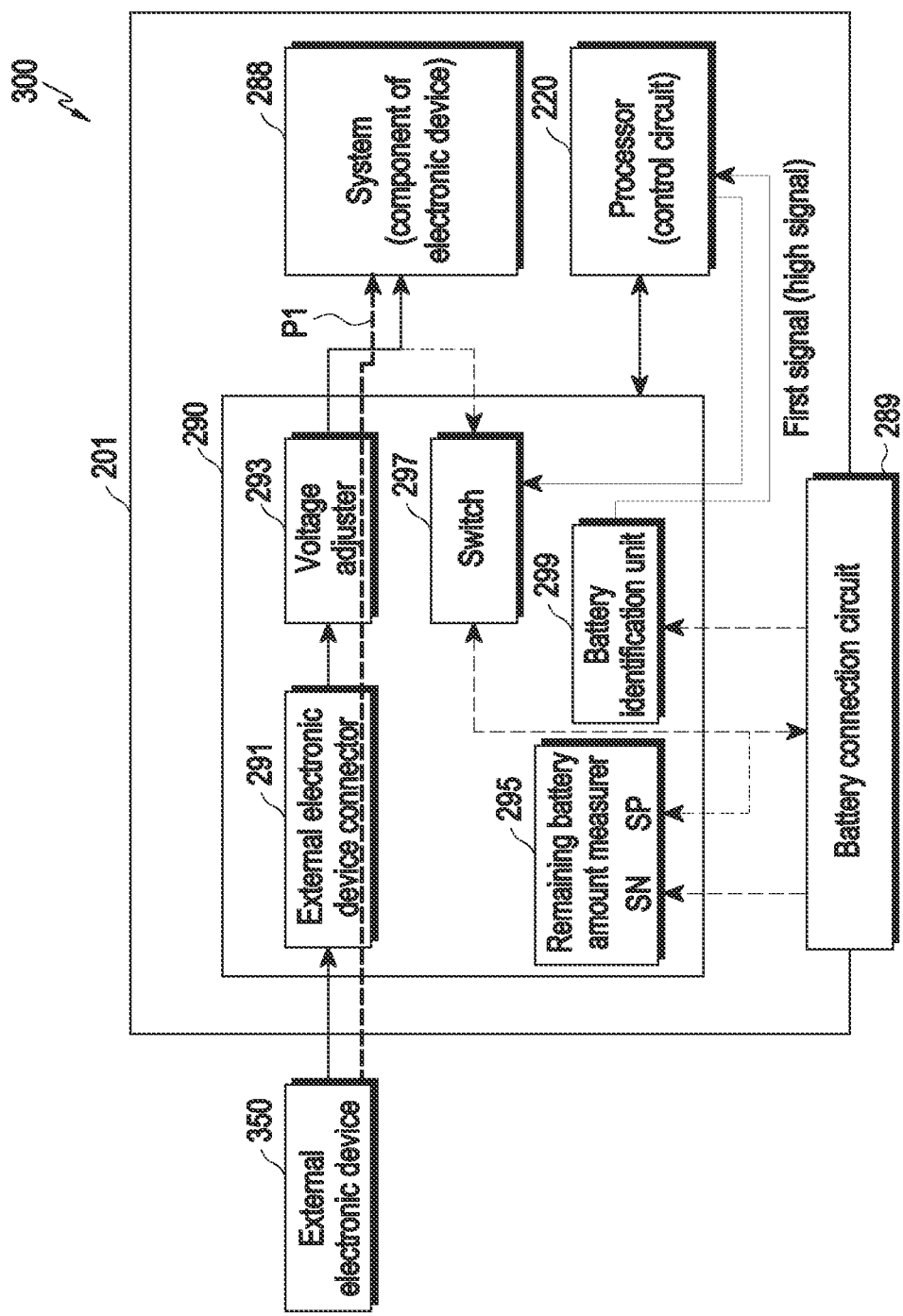
FIG. 3 is a diagram illustrating a first state of the electronic device according to various embodiments.

FIG. 3 is a diagram 300 illustrating a first state of the electronic device according to various embodiments.

Referring to FIG. 3, while a first signal (e.g., a high signal) indicating that no battery is connected to the battery connection circuit 289 is being received from the battery identification unit 299 of the charging circuit 290, if an external electronic device 350 is connected to the first electronic device 201, the processor 220 may perform switching to a first state in which power received from the external electronic device 350 is supplied to the system 288 (a component of the electronic device) of the electronic device. "P1" indicates a power path, and indicates that power from the external electronic device is supplied to the system 288 (a component of the electronic device) of the electronic device in the first state.

The processor 220 may control the charging circuit 290 in the first state so that the external electronic device 350 is connected to the external electronic device connector 291 to receive a voltage of the external electronic device 350, and the voltage of the external electronic device 350, which has been adjusted via the voltage adjuster 293, is provided to the system 288 (a component of the electronic device).

In the first state, when the battery is connected to the battery connection circuit 289, the processor 220 may control the switch 297 of the charging circuit 290, which is capable of providing power from the external electronic device 350 to the battery, to be in the open state. For example, while the battery is being connected to the battery connection circuit 289 and the battery voltage or capacity is being identified, the processor 220 may control the switch 297 to be in the open state.

Figure 4:
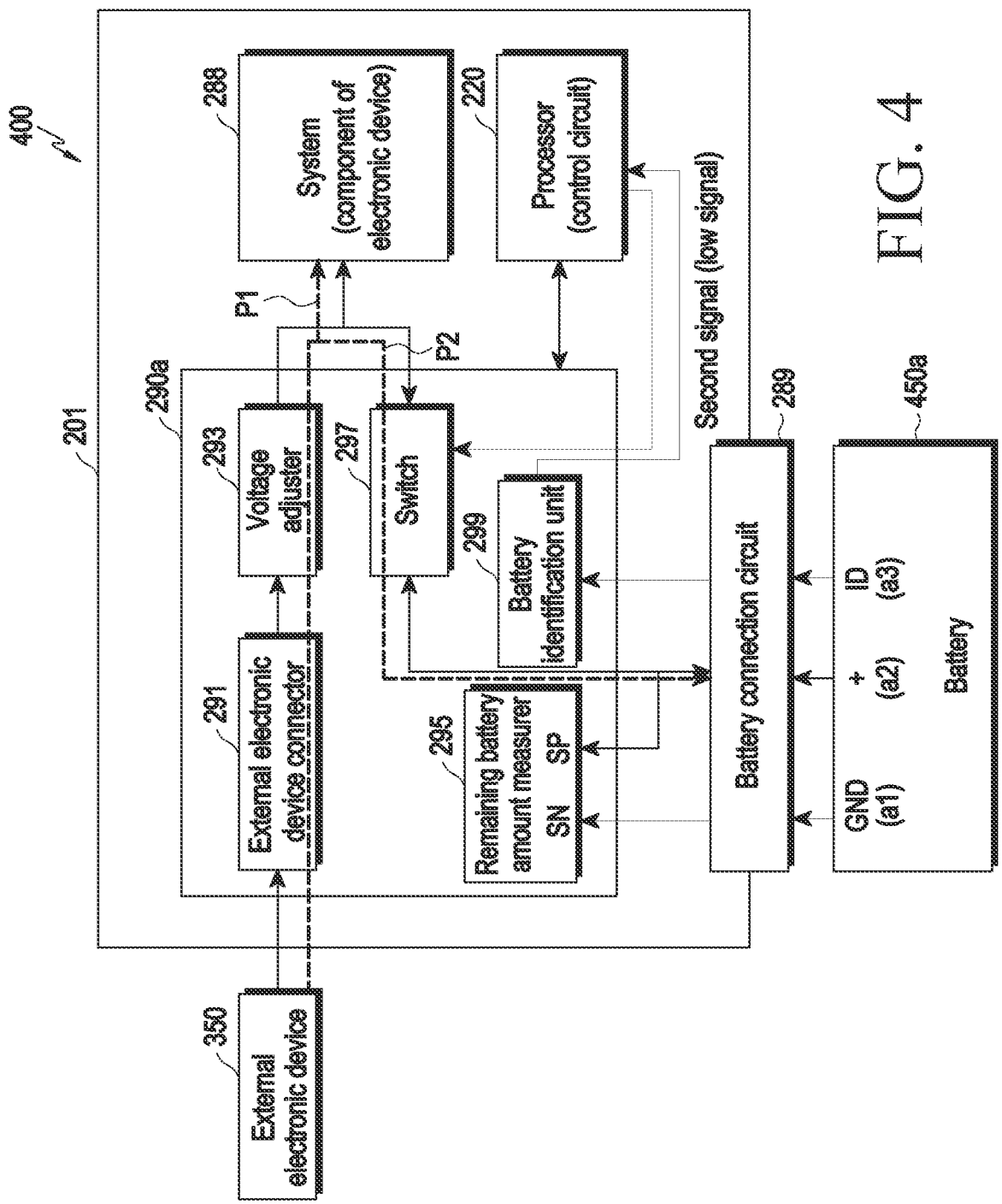
FIG. 4 is a diagram illustrating a second state of the electronic device according to various embodiments.

FIG. 4 is a diagram 400 illustrating a second state of the electronic device according to various embodiments.

Referring to FIG. 4, in the first state as shown in FIG. 3, when a connection of a removable battery 450*a* to the battery connection circuit 289 is identified, the processor 220 may control a charging circuit 290*a* (e.g., the charging circuit 290 of FIG. 3) to measure a voltage of the battery 450*a*, and after identifying, based on the measured voltage, the voltage or initial voltage of the battery 450*a*, power from the external electronic device 350 may be provided to the battery 450*a*.

When the battery 450*a* is connected to the battery connection circuit 289, the processor 220 may receive a second signal (low signal) from the battery identification unit 299 connected to an identification terminal a3 (ID terminal) of the battery 450*a*. According to an embodiment, the processor 220 may receive a separate resistance value indicating that the battery 450*a* is connected to the battery connection circuit 289.

The removable battery 450*a* may include a GND terminal a1, a power terminal a2 (+ terminal) that provides power, and the identification terminal a3 (ID terminal) for identification of the battery.

When the second signal (low signal) is received from the battery identification unit 299, the processor 220 may control the switch 297 to be in the open state to prevent power from the external electronic device 350 from being supplied to the battery 450*a* connected to the battery connection circuit 289

When the removable battery 450*a* is connected to the battery connection circuit 289, the processor 220 may control the remaining battery amount measurer 295 to identify the voltage or the capacity of the battery.

The remaining battery amount measurer 295 may include a first sensing terminal SN and a second sensing terminal SP, and the first sensing terminal SN may be connected to the GND terminal a1 of the battery 450*a*. The remaining battery amount measurer 295 may receive and measure the voltage of the battery 450*a* via the second sensing terminal SP connected to the power terminals a2 (+ terminal) of the battery 450*a*, and may identify, based on the measured voltage, the voltage or the capacity of the battery 450*a* to provide the same to the processor 220. The processor 220 may provide the capacity of the battery to the UI via the display.

When completion of voltage or capacity measurement of the battery is identified, the processor 220 may control the switch 297 to be in the closed state to connect the power terminal a2 (+ terminal) of the battery 450*a* and the voltage of the external electronic device 350, thereby performing switching to the second state in which power from the external electronic device 350 is supplied to the battery 450*a*.

In the second state, power from the external electronic device 350 may be supplied to the battery 450*a* to charge the battery 450*a*, while being supplied to the system 288 (a component of the electronic device) of the electronic device. "P1" and "P2" indicate power paths, and it is indicated that power from the external electronic device 350 is supplied to the battery 450*a* and the system 288 (a component of the electronic device) of the electronic device in the second state.

Figure 5:
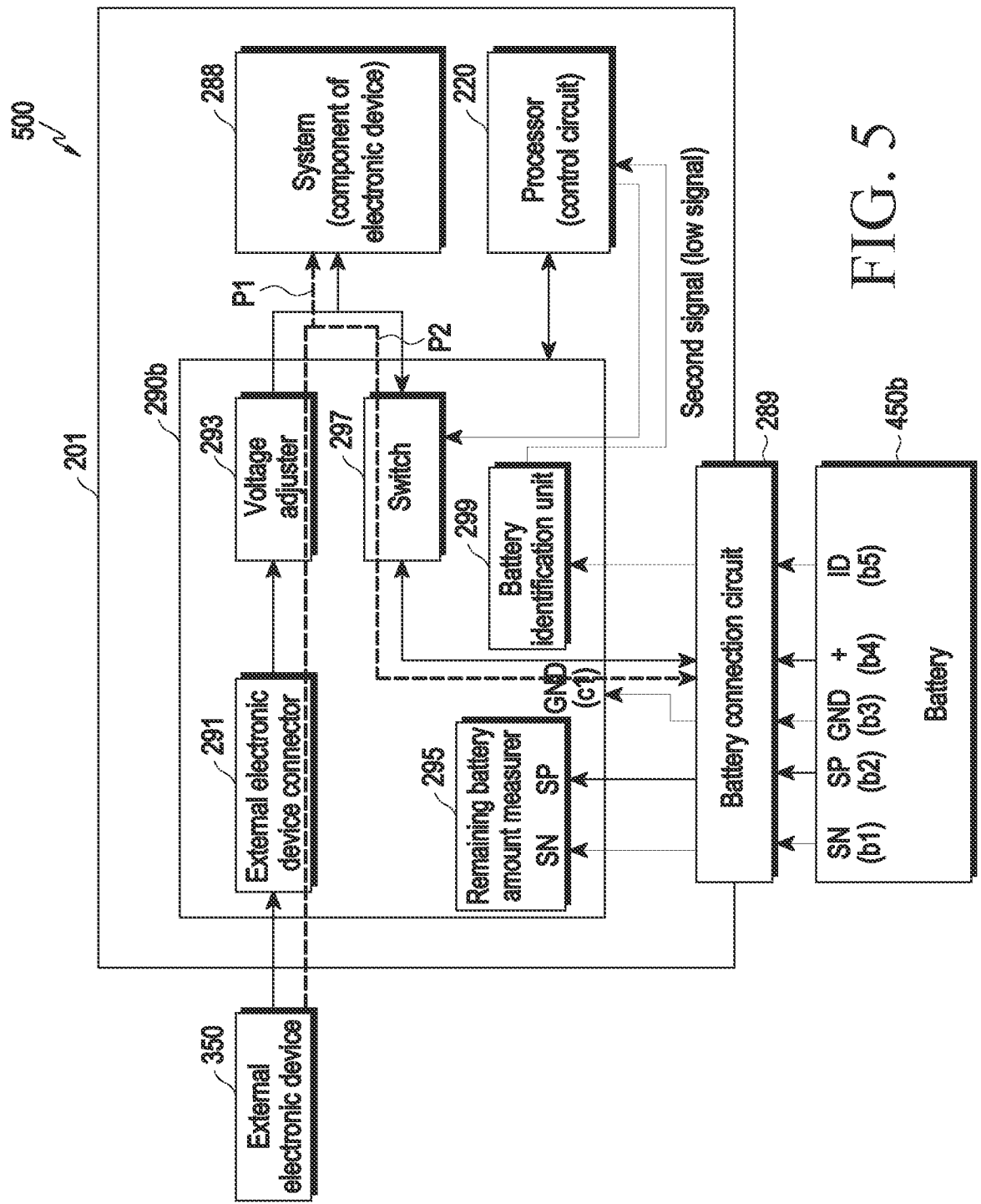
FIG. 5 is a diagram illustrating a second state of the electronic device according to various embodiments.

FIG. 5 is a diagram 500 illustrating a second state of the electronic device according to various embodiments.

Referring to FIG. 5, in the first state as shown in FIG. 3, when a connection of a removable battery 450*b* to the battery connection circuit 289 is identified, the processor 220 may control a charging circuit 290*b* (e.g., the charging circuit 290 of FIG. 3) to measure a voltage of the battery 450*b*, and after accurately identifying, based on the measured voltage, the initial voltage or initial capacity of the battery 450*b*, power from the external electronic device 350 may be provided to the battery 450*b*.

When the battery 450*b* is connected to the battery connection circuit 289, the processor 220 may receive a second signal (low signal) from the battery identification unit 299 connected to an identification terminal b5 (ID terminal) of the battery 450*b*.

The removable battery 450*b* may include a sensing terminal b1 connected to the first sensing terminal SN of the remaining battery amount measurer 295, a sensing terminal b2 connected to the second sensing terminal SP of the remaining battery amount measurer 295, a GND terminal b3 connected to a GND cl terminal of the charging circuit 290*b*, a power terminal b4 (+ terminal) that provides power, and the identification terminal b5 (ID terminal) for identification of the battery.

When the second signal (low signal) is received from the battery identification unit 299, the processor 220 may control the switch 297 to be in the open state to prevent power from the external electronic device 350 from being supplied to the battery 450*b* connected to the battery connection circuit 289.

When the removable battery 450*b* is connected to the battery connection circuit 289, the processor 220 may control the remaining battery amount measurer 295 to identify the voltage or the capacity of the battery.

The remaining battery amount measurer 295 may include the first sensing terminal SN and the second sensing terminal SP, may measure the voltage of the battery 450*b*, which is received from the sensing terminal SN and the sensing terminal SP which are connected to the sensing terminal b1 and sensing terminal b2 of the battery 450*b*, and may identify, based on the measured voltage, the voltage or the capacity of the battery 450*b* to provide the same to the processor 220. The processor 220 may provide the capacity of the battery to the UI via the display.

When completion of voltage or capacity measurement of the battery is identified, the processor 220 may control the switch 297 to be in the closed state to connect the power terminal b4 (+ terminal) of the battery 450b and the voltage of the external electronic device 350, thereby performing switching to the second state in which power from the external electronic device is supplied to the battery 450b.

In the second state, power from the external electronic device 350 may be supplied to the battery 450b to charge the battery 450b, while being supplied to the system 288 (a component of the electronic device) of the electronic device. "P1" and "P2" indicate power paths, and it is indicated that power from the external electronic device 350 is supplied to the battery 450b and the system 288 (a component of the electronic device) of the electronic device in the second state.

According to various embodiments, an electronic device may include a battery connection circuit (e.g., the battery connection circuit 289 of FIG. 2 to FIG. 5), a charging circuit (e.g., the charging circuit 290 of FIG. 2 to FIG. 5) configured to supply power received from an external electronic device (e.g., the external electronic device 350 of FIG. 2 to FIG. 5) to a battery (e.g., the battery 450a of FIG. 4 or the battery 450b of FIG. 5) and a component (e.g., the system 288 of FIG. 2 to FIG. 5) of the electronic device, and a processor (e.g., the processor (control circuit) of FIG. 2 to FIG. 5), wherein the processor is configured to, in a first state where the electronic device in which the battery is not connected to the battery connection circuit receives power from the external electronic device, measure a voltage of the battery if a connection of the battery to the battery connection circuit is established, and after a voltage or capacity of the battery is identified based on the measured voltage, perform switching to a second state where the charging circuit supplies power from the external electronic device to the battery connected to the battery connection circuit.

According to various embodiments, the charging circuit may include a switch (e.g., the switch 297 of FIG. 2 to FIG. 5), and the processor may be configured to, when the first state is identified, control the switch to be in the open state to prevent power from the external electronic device from being supplied to the battery connection circuit.

According to various embodiments, the charging circuit may include a switch (e.g., the switch 297 of FIG. 2 to FIG. 5), and the processor may be configured to, if a connection of the battery to the battery connection circuit is identified in the first state, control the switch to be in the open state to prevent power from the external electronic device from being supplied to the battery connection circuit.

According to various embodiments, when the voltage of the battery or the voltage or the capacity of the battery is identified, the processor may be configured to control the switch to be in the closed state to allow power from the external electronic device to be supplied to the battery.

According to various embodiments, the charging circuit may include an external electronic device connector (e.g., the external electronic device connector 291 of FIG. 2 to FIG. 5) configured to receive a voltage of the electronic device, a voltage adjuster (e.g., the voltage adjuster 293 of FIG. 2 to FIG. 5) configured to adjust a voltage received from the external electronic device to a reference voltage set in the electronic device, a remaining battery amount measurer (e.g., the remaining battery amount measurer 295 of FIG. 2 to FIG. 5) configured to measure a voltage of the battery connected to the electronic device and measure, based on the measured voltage, the voltage or the capacity of the battery, and a switch (e.g., the switch 297 of FIG. 2 to FIG. 5) configured to supply a voltage of the external electronic device, which is received via the electronic device, to the battery connected to the electronic device, and a battery identification unit (e.g., the battery identification unit 299 of FIG. 2 to FIG. 5) configured to recognize the battery mounted in the electronic device.

According to various embodiments, the processor may be configured to measure a voltage of the battery if the connection of the battery to the battery connection circuit is identified in the first state, perform switching to a third state, in which the battery receives power from the external electronic device, if the measured voltage of the battery is equal to or lower than a first threshold value, and display a low voltage of the battery in the third state via a UI.

According to various embodiments, the processor may be configured to measure a voltage of the battery if the connection of the battery to the battery connection circuit is identified in the first state, if the measured voltage of the battery is equal to or higher than the first threshold value, and the measured voltage of the battery is equal to or higher than a second threshold, recognize the battery as an abnormal battery and display a warning message informing that an abnormal battery is connected.

According to various embodiments, an electronic device may include a battery connection circuit (e.g., the battery connection circuit 289 of FIG. 2 to FIG. 5), a charging circuit (e.g., the charging circuit 290 of FIG. 2 to FIG. 5) configured to supply power received from an external electronic device (e.g., the external electronic device 350 of FIG. 2 to FIG. 5) to a battery (e.g., the battery 450a of FIG. 4 or the battery 450b of FIG. 5) and a component (e.g., the system 288 of FIG. 2 to FIG. 5) of the electronic device, a switch (e.g., the switch 297 of FIG. 2 to FIG. 5) configured to determine an open state or a closed state for an electrical path between the charging circuit and the battery connection circuit, and a processor (e.g., the processor (control circuit) of FIG. 2 to FIG. 5), wherein the processor is configured to determine the switch to be in the open state, identify a connection of the battery to the battery connection circuit, measure a voltage of the battery when the connection of the battery is identified, and control the switch to be in the closed state. According to various embodiments, the processor may be configured to, while the electronic device in which the battery is not connected to the battery connection circuit is receiving power from the external electronic device, control the switch to be in the open state.

According to various embodiments, the processor may be configured to, if the connection of the battery to the battery connection circuit is established while the electronic device in which the battery is not connected to the battery connection circuit is receiving power from the external electronic device, control the switch to be in the open state.

According to various embodiments, the processor may be configured to control the switch to be in the closed state to supply power from the external electronic device to the battery connected to the battery connection circuit.

Figure 6:
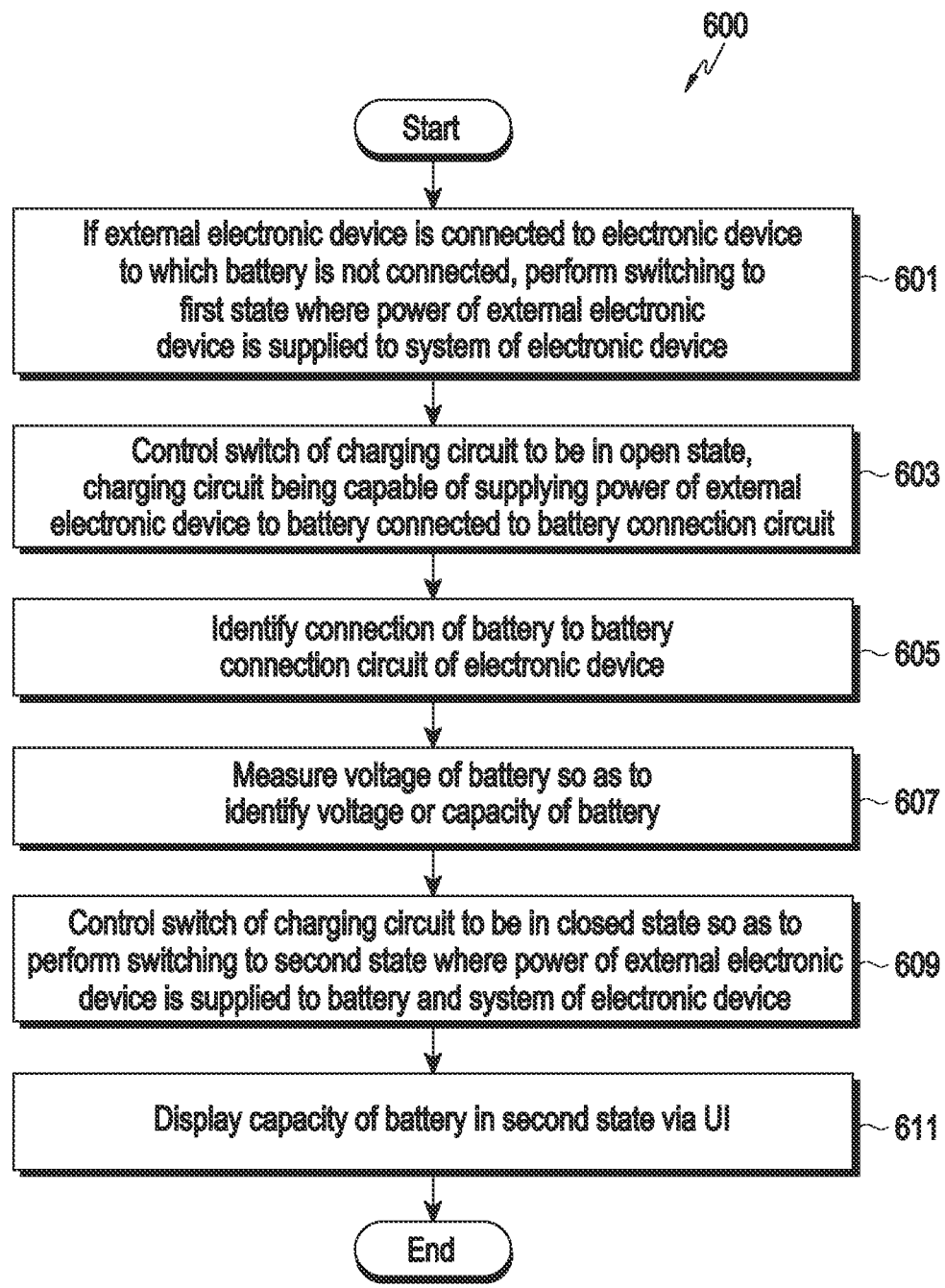
FIG. 6 is a flowchart illustrating operations of measuring a battery in an electronic device according to various embodiments.

FIG. 6 is a flowchart 600 illustrating operations of measuring a battery in an electronic device according to various embodiments. The operations of measuring the battery may include operations 601 to 611. According to an embodiment, at least one of operation 601 to operation 611 may be omitted, a sequence of some operations may be changed, or another operation may be added. The operations of measuring the battery may be performed by the electronic device 101 of FIG. 1, the electronic device 201 of FIG. 2 to FIG. 5, or the processor 220 of FIG. 2 to FIG. 5.

In operation 601, when an external electronic device (e.g., the external electronic device 350 of FIG. 3 to FIG. 5) is connected to an electronic device in which a removable battery is not connected to a battery connection circuit (e.g., the battery connection circuit 289 of FIG. 2 to FIG. 5), the electronic device 201 may perform switching to a first state where power from the external electronic device is supplied to a system (e.g., the system 288 (a component of the electronic device) of FIG. 2 to FIG. 5) of the electronic device.

According to an embodiment, the electronic device 201 may identify that no battery is connected to the battery connection circuit, based on a first signal (e.g., a high signal) received from a battery identification unit (e.g., the battery identification unit 299 of FIG. 2 and FIG. 3) of a charging circuit (e.g., the charging circuit 290 of FIG. 2 and FIG. 3, the charging circuit 290a of FIG. 4, or the charging circuit 290b of FIG. 5).

In operation 603, the electronic device 201 may control a switch (e.g., the switch 297 of FIG. 2 to FIG. 5) of the charging circuit (e.g., the charging circuit 290 of FIG. 2 and FIG. 3, the charging circuit 290a of FIG. 4, or the charging circuit 290b of FIG. 5) to be in the open state, the charging circuit being capable of supplying power from the external electronic device (e.g., the external electronic device 350 of FIG. 2 to FIG. 5) to the battery (e.g., the battery 450a of FIG. 4 or the battery 450b of FIG. 5) connected to the battery connection circuit (e.g., the battery connection circuit 289 of FIG. 2 to FIG. 5).

According to an embodiment, the electronic device 201 may control the switch of the charging circuit to be in the open state in the first state so that, when the battery is connected to the battery connection circuit, power is not received from the external electronic device (e.g., the external electronic device 350 of FIG. 3 to FIG. 5).

In operation 605, the electronic device 201 may identify whether the battery (e.g., the battery 450a of FIG. 4 or the battery 450b of FIG. 5) is connected to the battery connection circuit (e.g., the battery connection circuit 289 of FIG. 2 to FIG. 5).

According to an embodiment, the electronic device 201 may identify that the battery is connected to the battery connection circuit, based on a second signal (e.g., a low signal) received from the battery identification unit (e.g., the battery identification unit 299 of FIG. 2 to FIG. 5) of the charging circuit (e.g., the charging circuit 290 of FIG. 2 and FIG. 3, the charging circuit 290a of FIG. 4, or the charging circuit 290b of FIG. 5) in the first state.

In operation 607, the electronic device 201 may identify a voltage or capacity of the battery by measuring the voltage of the battery.

According to an embodiment, the electronic device 201 may control the charging circuit (e.g., the charging circuit of FIG. 2 and FIG. 3, the charging circuit 290a of FIG. 4, or the charging circuit 290b of FIG. 5) to measure the voltage of the battery (e.g., the battery 450a of FIG. 4 or the battery 450b of FIG. 5) in the first state, and may identify the voltage or the capacity of the battery, based on the measured voltage.

According to an embodiment, the electronic device 201 may measure the voltage of the battery (e.g., the battery 450a of FIG. 4), which is received via a second sensing terminal SP of a remaining battery amount measurer (e.g., the remaining battery amount measurer 295 of FIG. 4) of the charging circuit (e.g., the charging circuit 290a of FIG. 4) connected to a power terminal (e.g., the power terminal a2 of FIG. 4) of the battery, and may identify the capacity of the battery, based on the measured voltage.

According to an embodiment, the electronic device 201 may measure the voltage of the battery (e.g., the battery 450b in FIG. 5), which is received via a first sensing terminal SN and the second sensing terminal SP of the remaining battery amount measurer (e.g., the remaining battery amount measurer 295 of FIG. 5) of the charging circuit (e.g., the charging circuit 290b of FIG. 5) connected to two sensing terminals (e.g., the sensing terminals b1 and b2 of FIG. 5) of the battery, and may identify the voltage or the capacity of the battery, based on the measured voltage.

In operation 609, the electronic device 201 may control the switch (e.g., the switch 297 of FIG. 2 to FIG. 5) of the charging circuit (e.g., the charging circuit 290 of FIG. 2 and FIG. 3, the charging circuit 290a of FIG. 4, or the charging circuit 290b of FIG. 5) to be in the closed state, to perform switching to a second state where power from the external electronic device (e.g., the external electronic device 350 of FIG. 2 to FIG. 5) is supplied to the battery (e.g., the battery 450a of FIG. 4 or the battery 450b of FIG. 5) connected to the battery connection circuit (e.g., the battery connection circuit 289 of FIG. 2 to FIG. 5) and the system (e.g., the system 288 (a component of the electronic device) of FIG. 2 to FIG. 5) of the electronic device.

According to an embodiment, when the charging circuit is controlled to identify the voltage or the capacity of the battery in the first state, the electronic device 201 may control the switch to be in the closed state by controlling the charging circuit. The electronic device may connect the battery and the voltage adjuster (e.g., the voltage adjuster 293 of FIG. 2 to FIG. 5) by controlling the switch to be in the closed state, to perform switching to the second state in which power from the external electronic device (e.g., the external electronic device 350 of FIG. 4 and FIG. 5), which is received from the voltage adjuster, is provided to the system of the electronic device, while concurrently being used to charge the battery.

In operation 611, the electronic device 201 may display the capacity of the battery in the second state via a UI.

Figure 7:
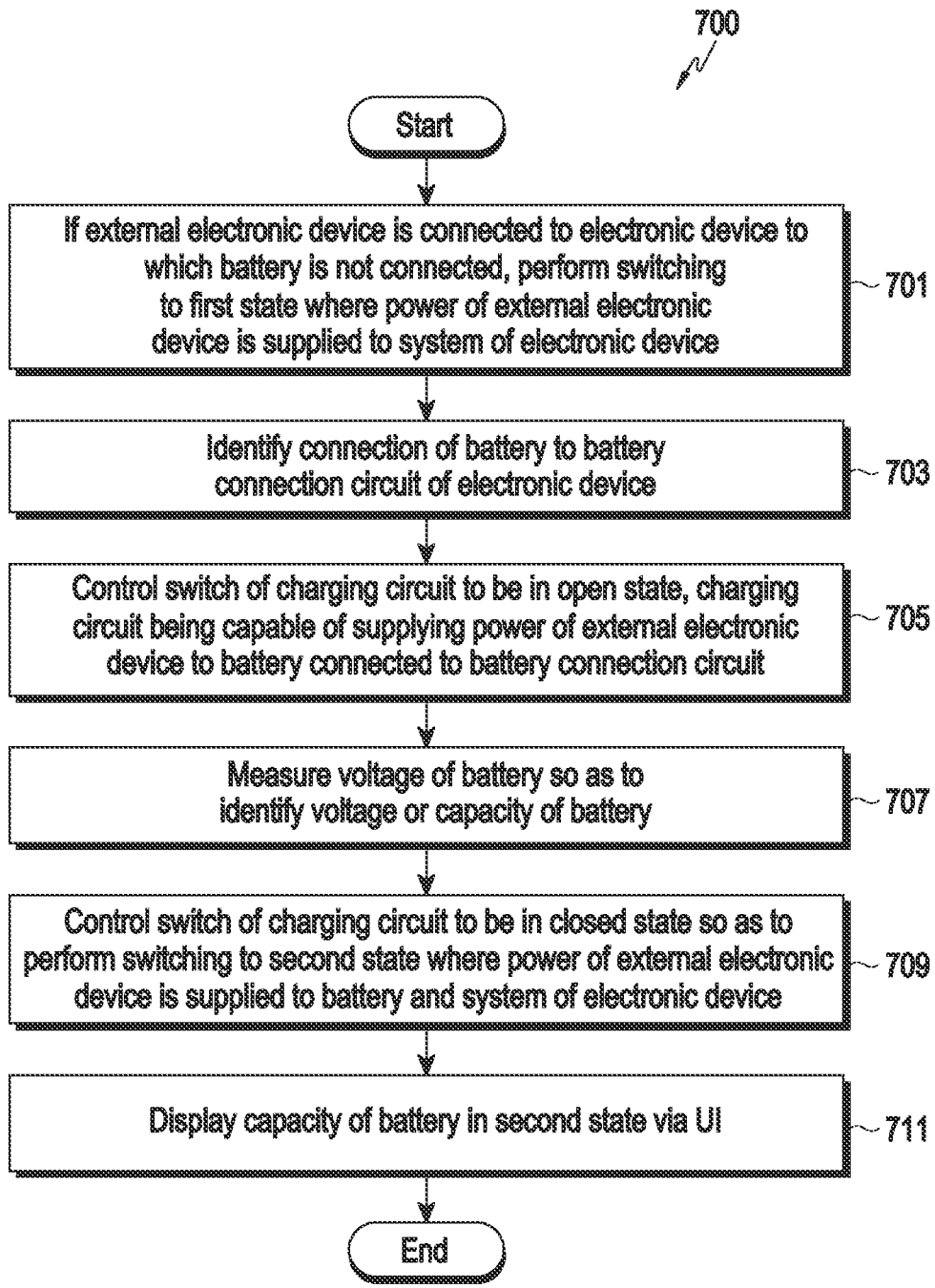
FIG. 7 is a flowchart illustrating operations of measuring a battery in an electronic device according to various embodiments.

FIG. 7 is a flowchart 700 illustrating operations of measuring a battery in an electronic device according to various embodiments. The operations of measuring the battery may include operations 701 to 711. According to an embodiment, at least one of operation 701 to operation 711 may be omitted, a sequence of some operations may be changed, or another operation may be added. The operations of measuring the battery may be performed by the electronic device 101 of FIG. 1, the electronic device 201 of FIG. 2 to FIG. 5, or the processor 220 of FIG. 2 to FIG. 5.

In operation 701, when an external electronic device (e.g., the external electronic device 350 of FIG. 4 and FIG. 5) is connected to an electronic device in which a removable battery is not connected to a battery connection circuit (e.g., the battery connection circuit 289 of FIG. 2 to FIG. 5), the electronic device 201 may perform switching to a first state where power from the external electronic device is supplied to a system (e.g., the system 288 (a component of the electronic device) of FIG. 2 to FIG. 5) of the electronic device.

According to an embodiment, the electronic device 201 may identify that the battery is not connected to the battery connection circuit, based on a first signal (e.g., a high signal) received from a battery identification unit (e.g., the battery identification unit 299 of FIG. 2 and FIG. 3) of a charging circuit (e.g., the charging circuit 290 of FIG. 2 and FIG. 3).

In operation 703, the electronic device 201 may identify a connection of the battery (e.g., the battery 450a of FIG. 4 or the battery 450b of FIG. 5) to the battery connection circuit (e.g., the battery connection circuit 289 of FIG. 2 to FIG. 5).

According to an embodiment, the electronic device 201 may identify that the battery is connected to the battery connection circuit, based on a second signal (e.g., a low signal) received from the battery identification unit (e.g., the battery identification unit 299 of FIG. 2 to FIG. 5) of the charging circuit (e.g., the charging circuit 290 of FIG. 2 and FIG. 3, the charging circuit 290a of FIG. 4, or the charging circuit 290b of FIG. 5) in the first state.

In operation 705, the electronic device 201 may control a switch (e.g., the switch 297 of FIG. 2 to FIG. 5) of the charging circuit (e.g., the charging circuit 290 of FIG. 2 and FIG. 3, the charging circuit 290a of FIG. 4, or the charging circuit 290b of FIG. 5) to be in the open state, the charging circuit being capable of supplying power from the external electronic device (e.g., the external electronic device 350 of FIG. 2 to FIG. 5) to the battery (e.g., the battery 450a of FIG. 4 or the battery 450b of FIG. 5) connected to the battery connection circuit (e.g., the battery connection circuit 289 of FIG. 2 to FIG. 5).

According to an embodiment, if the connection of the battery to the battery connection circuit is identified in the first state, the electronic device 201 may control the switch of the charging circuit to be in the open state to prevent power from the external electronic device from being supplied to the battery connected to the battery connection circuit.

In operation 707, the electronic device 201 may identify a voltage or capacity of the battery by measuring the voltage of the battery.

According to an embodiment, the electronic device 201 may control the charging circuit (e.g., the charging circuit 290 of FIG. 2 and FIG. 3, the charging circuit 290a of FIG. 4, or the charging circuit 290b of FIG. 5) to measure the voltage of the battery (e.g., the battery 450a of FIG. 4 or the battery 450b of FIG. 5) in the first state, and may identify the voltage or the capacity of the battery, based on the measured voltage.

According to an embodiment, the electronic device 201 may measure the voltage of the battery (e.g., the battery 450a of FIG. 4), which is received via a second sensing terminal SP of a remaining battery amount measurer (e.g., the remaining battery amount measurer 295 of FIG. 4) of the charging circuit (e.g., the charging circuit 290a of FIG. 4) connected to a power terminal (e.g., the power terminal a2 of FIG. 4) of the battery, and may identify the voltage or the capacity of the battery, based on the measured voltage.

According to an embodiment, the electronic device 201 may measure the voltage of the battery (e.g., the battery 450b in FIG. 5), which is received via a first sensing terminal SN and the second sensing terminal SP of the remaining battery amount measurer (e.g., the remaining battery amount measurer 295 of FIG. 5) of the charging circuit (e.g., the charging circuit 290b of FIG. 5) connected to two sensing terminals (e.g., the sensing terminals b1 and b2 of FIG. 5) of the battery, and may identify the voltage or the capacity of the battery, based on the measured voltage.

In operation 709, the electronic device 201 may control the switch (e.g., the switch 297 of FIG. 2 to FIG. 5) of the charging circuit (e.g., the charging circuit 290 of FIG. 2 and FIG. 3, the charging circuit 290a of FIG. 4, or the charging circuit 290b of FIG. 5) to be in the closed state, to perform switching to a second state where power from the external electronic device (e.g., the external electronic device 350 of FIG. 2 to FIG. 5) is supplied to the battery (e.g., the battery 450a of FIG. 4 or the battery 450b of FIG. 5) and the system (e.g., the system 288 (a component of the electronic device) of FIG. 2 to FIG. 5) of the electronic device.

According to an embodiment, when the charging circuit is controlled to identify the voltage or the capacity of the battery in the first state, the electronic device 201 may control the switch of the charging circuit to be in the closed state. The electronic device may connect the battery and the voltage adjuster (e.g., the voltage adjuster 293 of FIG. 2 to FIG. 5) by controlling of the switch to be in the closed state, to perform switching to the second state in which power from the external electronic device (e.g., the external electronic device 350 of FIG. 4 and FIG. 5), which is received from the voltage adjuster, is provided to the system of the electronic device, while concurrently being used to charge the battery.

In operation 711, the electronic device 201 may display the capacity of the battery in the second state via the UI.

Figure 8:
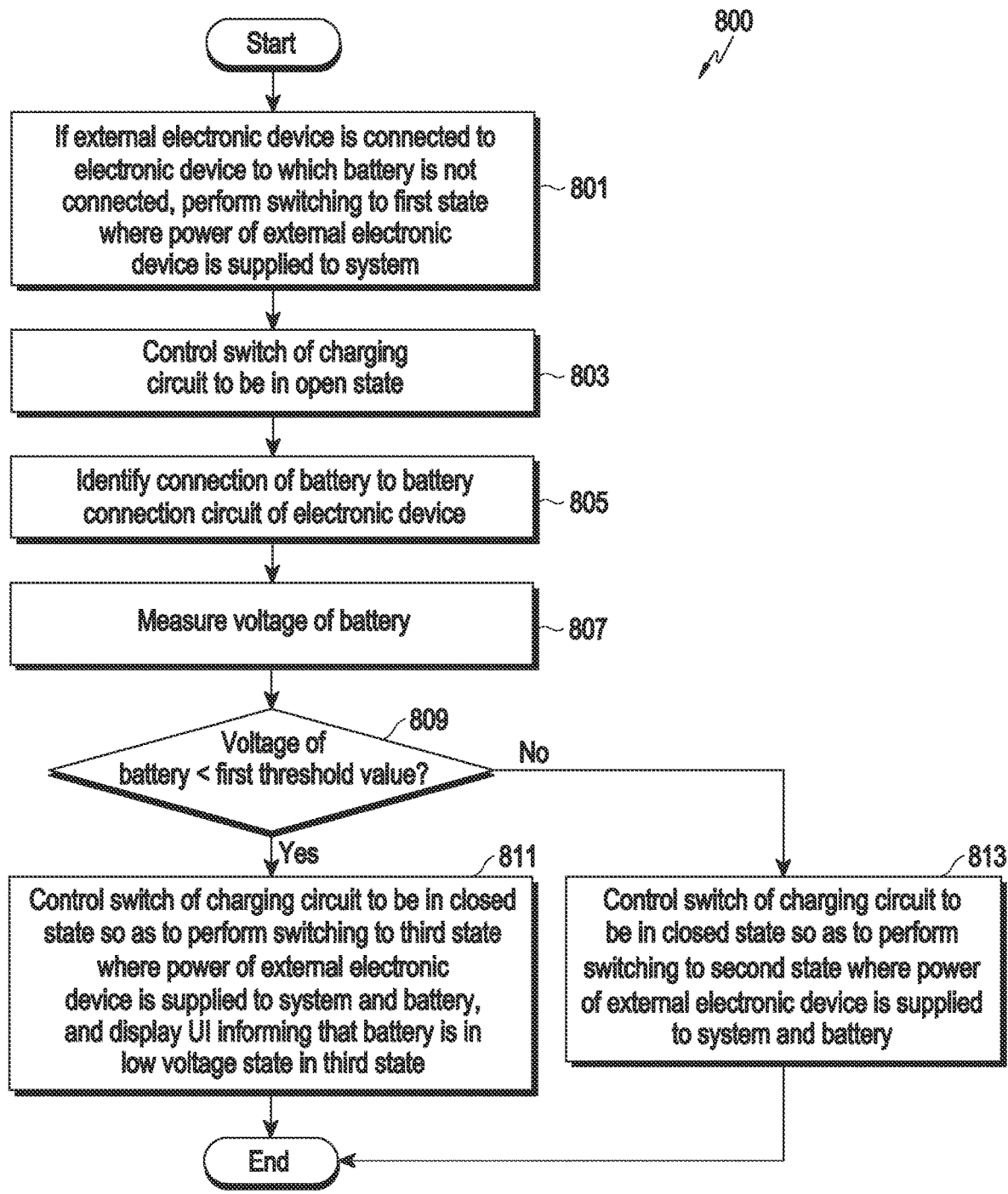
FIG. 8 is a flowchart illustrating operations of measuring a battery in an electronic device according to various embodiments.

FIG. 8 is a flowchart 800 illustrating operations of measuring a battery in an electronic device according to various embodiments. The operations of measuring the battery may include operations 801 to 813. According to an embodiment, at least one of operation 801 to operation 813 may be omitted, a sequence of some operations may be changed, or another operation may be added. The operations of measuring the battery may be performed by the electronic device 101 of FIG. 1, the electronic device 201 of FIG. 2 to FIG. 5, or the processor 220 of FIG. 2 to FIG. 5.

In operation 801, when an external electronic device (e.g., the external electronic device 350 of FIG. 4 and FIG. 5) is connected to an electronic device in which a removable battery (e.g., the battery 450a of FIG. 4 or the battery 450b of FIG. 5) is not connected to a battery connection circuit (e.g., the battery connection circuit 289 of FIG. 2 to FIG. 5), the electronic device 201 may perform switching to a first state where power from the external electronic device is supplied to a system (e.g., the system 288 (a component of the electronic device) of FIG. 2 to FIG. 5) of the electronic device.

According to an embodiment, the electronic device 201 may identify that the battery is not connected to the battery connection circuit, based on a first signal (e.g., a high signal) received from a battery identification unit (e.g., the battery identification unit 299 of FIG. 2 and FIG. 3) of a charging circuit (e.g., the charging circuit 290 of FIG. 2 and FIG. 3).

In operation 803, the electronic device 201 may control a switch (e.g., the switch 297 of FIG. 2 to FIG. 5) of the charging circuit (e.g., the charging circuit 290 of FIG. 2 and FIG. 3, the charging circuit 290a of FIG. 4, or the charging circuit 290b of FIG. 5) to be in the open state, the charging circuit being capable of supplying power from the external electronic device (e.g., the external electronic device 350 of FIG. 2 to FIG. 5) to the battery (e.g., the battery 450a of FIG. 4 or the battery 450b of FIG. 5) connected to the battery connection circuit (e.g., the battery connection circuit 289 of FIG. 2 to FIG. 5).

According to an embodiment, the electronic device 201 may control the switch of the charging circuit to be in the open state in the first state, to prevent power from the external electronic device from being supplied to the battery when the battery is connected to the battery connection circuit.

According to an embodiment, the electronic device 201 may control the switch of the charging circuit to be in the open state, in operation 805 of identifying the connection of the battery to the battery connection circuit.

In operation 805, the electronic device 201 may identify the connection of the battery (e.g., the battery 450a of FIG. 4 or the battery 450b of FIG. 5) to the battery connection circuit (e.g., the battery connection circuit 289 of FIG. 2 to FIG. 5).

According to an embodiment, the electronic device 201 may identify that the battery is connected to the battery connection circuit, based on a second signal (e.g., a low signal) received from the battery identification unit (e.g., the battery identification unit 299 of FIG. 2 to FIG. 5) of the charging circuit (e.g., the charging circuit 290 of FIG. 2 and FIG. 3, the charging circuit 290a of FIG. 4, or the charging circuit 290b of FIG. 5) in the first state. In operation 807, the electronic device 201 may measure a voltage of the battery (e.g., the battery 450a of FIG. 4 or the battery 450b of FIG. 5).

According to an embodiment, the electronic device 201 may control the charging circuit (e.g., the charging circuit of FIG. 2 and FIG. 3, the charging circuit 290a of FIG. 4, or the charging circuit 290b of FIG. 5) to measure the voltage of the battery in the first state, and may identify the voltage or the capacity of the battery, based on the measured voltage.

According to an embodiment, the electronic device 201 may measure the voltage of the battery (e.g., the battery 450a of FIG. 4), which is received via a second sensing terminal SP of a remaining battery amount measurer (e.g., the remaining battery amount measurer 295 of FIG. 4) of the charging circuit (e.g., the charging circuit 290a of FIG. 4) connected to a power terminal (e.g., the power terminal a2 of FIG. 4) of the battery, and may identify the voltage or the capacity of the battery, based on the measured voltage.

According to an embodiment, the electronic device 201 may measure the voltage of the battery (e.g., the battery 450b in FIG. 5), which is received via a first sensing terminal SN and the second sensing terminal SP of the remaining battery amount measurer (e.g., the remaining battery amount measurer 295 of FIG. 5) of the charging circuit (e.g., the charging circuit 290b of FIG. 5) connected to two sensing terminals (e.g., the sensing terminals b1 and b2 of FIG. 5) of the battery, and may identify the voltage or the capacity of the battery, based on the measured voltage.

In operation 809, the electronic device 201 may compare the voltage of the battery with a first threshold value to determine whether the voltage of the battery is lower than the first threshold value.

According to an embodiment, the electronic device 201 may compare the voltage of the battery with a first threshold value for determination of a low voltage and may determine that the voltage of the battery is in a low voltage state.

For example, if the battery outputs a range of about 3.4V to 4.4V, outputs a voltage of about 4.4V when fully charged, and outputs a voltage of about 3.4V when fully discharged, the first threshold value may be about 3.4V.

In operation 811, the electronic device 201 may control the switch (e.g., the switch 297 of FIG. 2 to FIG. 5) of the charging circuit (e.g., the charging circuit 290 of FIG. 2 and FIG. 3, the charging circuit 290a of FIG. 4, or the charging circuit 290b of FIG. 5) to be in the closed state, to perform switching to a third state where power from the external electronic device (e.g., the external electronic device 350 of FIG. 2 to FIG. 5) is supplied to the battery (e.g., the battery 450a of FIG. 4 or the battery 450b of FIG. 5) connected to the battery connection circuit (e.g., the battery connection circuit 289 of FIG. 2 to FIG. 5) and the system (e.g., the system 288 (a component of the electronic device) of FIG. 2 to FIG. 5) of the electronic device, and may display a UI informing that the battery is in the low voltage state in the third state.

According to an embodiment, the electronic device 201 may control the switch of the charging circuit to be in the closed state, may display the UI informing of the low voltage of the battery, may turn off the power from the electronic device, and then may perform switching to the third state where power from the external electronic device is supplied only to the battery. The electronic device 201 may display the capacity of the battery in the third state via the UI.

If the electronic device 201 identifies, as a result of the comparison between the voltage of the battery and the first threshold value in operation 809, that the voltage of the battery is higher than the first threshold value, the electronic device 201 in operation 813 may control the switch (e.g., the switch 297 of FIG. 2 to FIG. 5) of the charging circuit (e.g., the charging circuit 290 of FIG. 2 and FIG. 3, the charging circuit 290a of FIG. 4, or the charging circuit 290b of FIG. 5) to be in the closed state, to perform switching to a second state where power from the external electronic device (e.g., the external electronic device 350 of FIG. 2 to FIG. 5) is provided to the battery (e.g., the battery 450a of FIG. 4 or the battery 450b of FIG. 5) connected to the battery connection circuit (e.g., the battery connection circuit 289 of FIG. 2 to FIG. 5) and the system (e.g., the system 288 (a component of the electronic device) of FIG. 2 to FIG. 5) of the electronic device.

According to an embodiment, the electronic device 201 may display the capacity of the battery in the second state via the UI.

Figure 9:
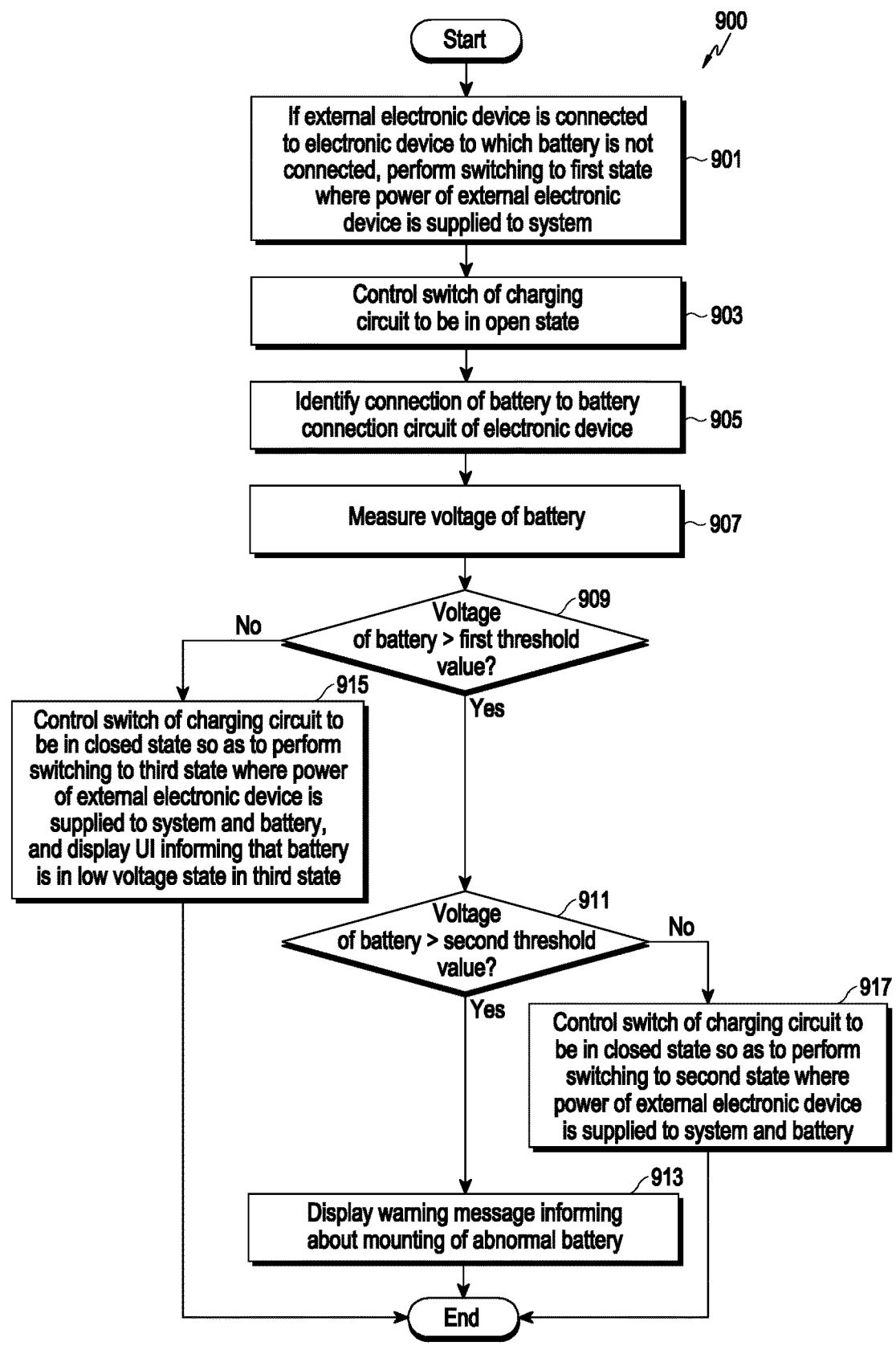
FIG. 9 is a flowchart illustrating operations of measuring a battery in an electronic device according to various embodiments.

FIG. 9 is a flowchart 900 illustrating operations of measuring a battery in an electronic device according to various embodiments. The operations of measuring the battery may include operations 901 to 917. According to an embodiment, at least one of operation 901 to operation 917 may be omitted, a sequence of some operations may be changed, or another operation may be added. The operations of measuring the battery may be performed by the electronic device 101 of FIG. 1, the electronic device 201 of FIG. 2 to FIG. 5, or the processor 220 of FIG. 2 to FIG. 5.

In operation 901, when an external electronic device (e.g., the external electronic device 350 of FIG. 4 and FIG. 5) is connected to an electronic device in which a removable battery (e.g., the battery 450a of FIG. 4 or the battery 450b of FIG. 5) is not connected to a battery connection circuit (e.g., the battery connection circuit of FIG. 2 to FIG. 5), the electronic device 201 may perform switching to a first state where power from the external electronic device is supplied to a system (e.g., the system 288 (a component of the electronic device) of FIG. 2 to FIG. 5) of the electronic device.

According to an embodiment, the electronic device 201 may identify that the battery is not connected to the electronic device, based on a first signal (e.g., a high signal) received from a battery identification unit (e.g., the battery identification unit 299 of FIG. 2 and FIG. 3) of a charging circuit (e.g., the charging circuit 290 of FIG. 2 and FIG. 3).

In operation 903, the electronic device 201 may control a switch (e.g., the switch 297 of FIG. 2 to FIG. 5) of the charging circuit (e.g., the charging circuit 290 of FIG. 2 and FIG. 3, the charging circuit 290a of FIG. 4, or the charging circuit 290b of FIG. 5) to be in the open state, the charging circuit being capable of supplying power from the external electronic device (e.g., the external electronic device 350 of FIG. 2 to FIG. 5) to the battery (e.g., the battery 450a of FIG.

4 or the battery 450*b* of FIG. 5) connected to the battery connection circuit (e.g., the battery connection circuit 289 of FIG. 2 to FIG. 5).

According to an embodiment, the electronic device 201 may control the switch of the charging circuit to be in the open state in the first state, to prevent power from the external electronic device from being supplied to the battery when the battery is connected to the battery connection circuit.

According to an embodiment, the electronic device 201 may control the switch of the charging circuit to be in the open state, in operation 905 of identifying the connection of the battery to the battery connection circuit.

In operation 905, the electronic device 201 may identify the connection of the battery (e.g., the battery 450*a* of FIG. 4 or the battery 450*b* of FIG. 5) to the battery connection circuit (e.g., the battery connection circuit 289 of FIG. 2 to FIG. 5).

According to an embodiment, the electronic device 201 may identify that the battery is connected to the electronic device, based on a second signal (e.g., a low signal) received from the battery identification unit (e.g., the battery identification unit 299 of FIG. 2 to FIG. 5) of the charging circuit (e.g., the charging circuit 290 of FIG. 2 and FIG. 3, the charging circuit 290*a* of FIG. 4, or the charging circuit 290*b* of FIG. 5) in the first state.

In operation 907, the electronic device 201 may measure a voltage of the battery (e.g., the battery 450*a* of FIG. 4 or the battery 450*b* of FIG. 5).

According to an embodiment, the electronic device 201 may control the charging circuit (e.g., the charging circuit of FIG. 2 and FIG. 3, the charging circuit 290*a* of FIG. 4, or the charging circuit 290*b* of FIG. 5) to measure the voltage of the battery in the first state, and may identify the voltage or the capacity of the battery, based on the measured voltage.

According to an embodiment, the electronic device 201 may measure the voltage of the battery, which is received via a second sensing terminal SP of a remaining battery amount measurer (e.g., the remaining battery amount measurer 295 of FIG. 4) of the charging circuit (e.g., the charging circuit 290*a* of FIG. 4) connected to a power terminal (e.g., the power terminal a2 of FIG. 4) of the battery, and may identify the voltage or the capacity of the battery, based on the measured voltage.

According to an embodiment, the electronic device 201 may measure the voltage of the battery (e.g., the battery 450*b* in FIG. 5), which is received via a first sensing terminal SN and the second sensing terminal SP of the remaining battery amount measurer (e.g., the remaining battery amount measurer 295 of FIG. 5) of the charging circuit (e.g., the charging circuit 290*b* of FIG. 5) connected to two sensing terminals (e.g., the sensing terminals b1 and b2 of FIG. 5) of the battery, and may identify the voltage or the capacity of the battery, based on the measured voltage.

In operation 909, the electronic device 201 may compare the voltage of the battery with a first threshold value to identify that the voltage of the battery is higher than the first threshold value.

In operation 911, the electronic device 201 may compare the voltage of the battery with a second threshold value to identify that the voltage of the battery is higher than the second threshold value.

According to an embodiment, the electronic device 201 may identify that the voltage of the battery higher than the first threshold value is higher than the second threshold value, and may identify that the battery is an abnormal battery.

For example, if the battery outputs a range of about 3.4V to 4.4V, outputs a voltage of about 4.4V when fully charged, and outputs a voltage of about 3.4V when fully discharged, the second threshold value may be about 4.5V.

In operation 913, the electronic device 201 may display a warning message informing that an abnormal battery is connected.

According to an embodiment, when the battery is identified to be an abnormal battery, the electronic device 201 may maintain the first state where power from the external electronic device (e.g., the external electronic device 350 of FIG. 4 and FIG. 5) is supplied to the system (e.g., the system 288 (a component of the electronic device) of FIG. 2 to FIG. 5) of the electronic device.

If the electronic device 201 compares the voltage of the battery with the first threshold value to identify, in operation 909, that the voltage of the battery is lower than the first threshold value, the electronic device 201 in operation 915 may control the switch (e.g., the switch 297 of FIG. 2 to FIG. 5) of the charging circuit (e.g., the charging circuit 290 of FIG. 2 and FIG. 3, the charging circuit 290*a* of FIG. 4, or the charging circuit 290*b* of FIG. 5) to be in the closed state to perform switching to a third state where power from the external electronic device (e.g., the external electronic device 350 of FIG. 2 to FIG. 5) is supplied to the battery (e.g., the battery 450*a* of FIG. 4 or the battery 450*b* of FIG. 5) and the system (e.g., the system 288 (a component of the electronic device) of FIG. 2 to FIG. 5) of the electronic device, and may display the UI informing that the battery is in the low voltage state in the third state.

According to an embodiment, the electronic device 201 may display the UI informing of the low voltage state of the battery, may turn off the power from the electronic device, and then may perform switching to the third state where power from the external electronic device is supplied to only the battery, and the capacity of the battery in the third state may be displayed via the UI.

If the electronic device 201 compares the voltage of the battery with the second threshold value to identify, in operation 911, that the voltage of the battery is lower than the second threshold value, the electronic device 201 in operation 917 may control the switch (e.g., the switch 297 of FIG. 2 to FIG. 5) of the charging circuit (e.g., the charging circuit 290 of FIG. 2 and FIG. 3, the charging circuit 290*a* of FIG. 4, or the charging circuit 290*b* of FIG. 5) to be in the closed state to perform switching to the second state where power from the external electronic device (e.g., the external electronic device 350 of FIG. 2 to FIG. 5) is supplied to the battery (e.g., the battery 450*a* of FIG. 4 or the battery 450*b* of FIG. 5) and the system (e.g., the system 288 (a component of the electronic device) of FIG. 2 to FIG. 5) of the electronic device. According to an embodiment, the electronic device 201 may control the charging circuit (e.g., the charging circuit 290 of FIG. 2 and FIG. 3, the charging circuit 290*a* of FIG. 4, or the charging circuit 290*b* of FIG. 5) to connect the battery and the voltage adjuster (e.g., the voltage adjuster 293 of FIG. 2 to FIG. 5), thereby providing power from the external electronic device (e.g., the external electronic device 350 of FIG. 4 and FIG. 5), which is received from the voltage adjuster, to the system of the electronic device while concurrently providing the same to the battery to charge the battery.

According to an embodiment, the electronic device 201 may display the capacity of the battery in the second state via the UI.

Figure 10:
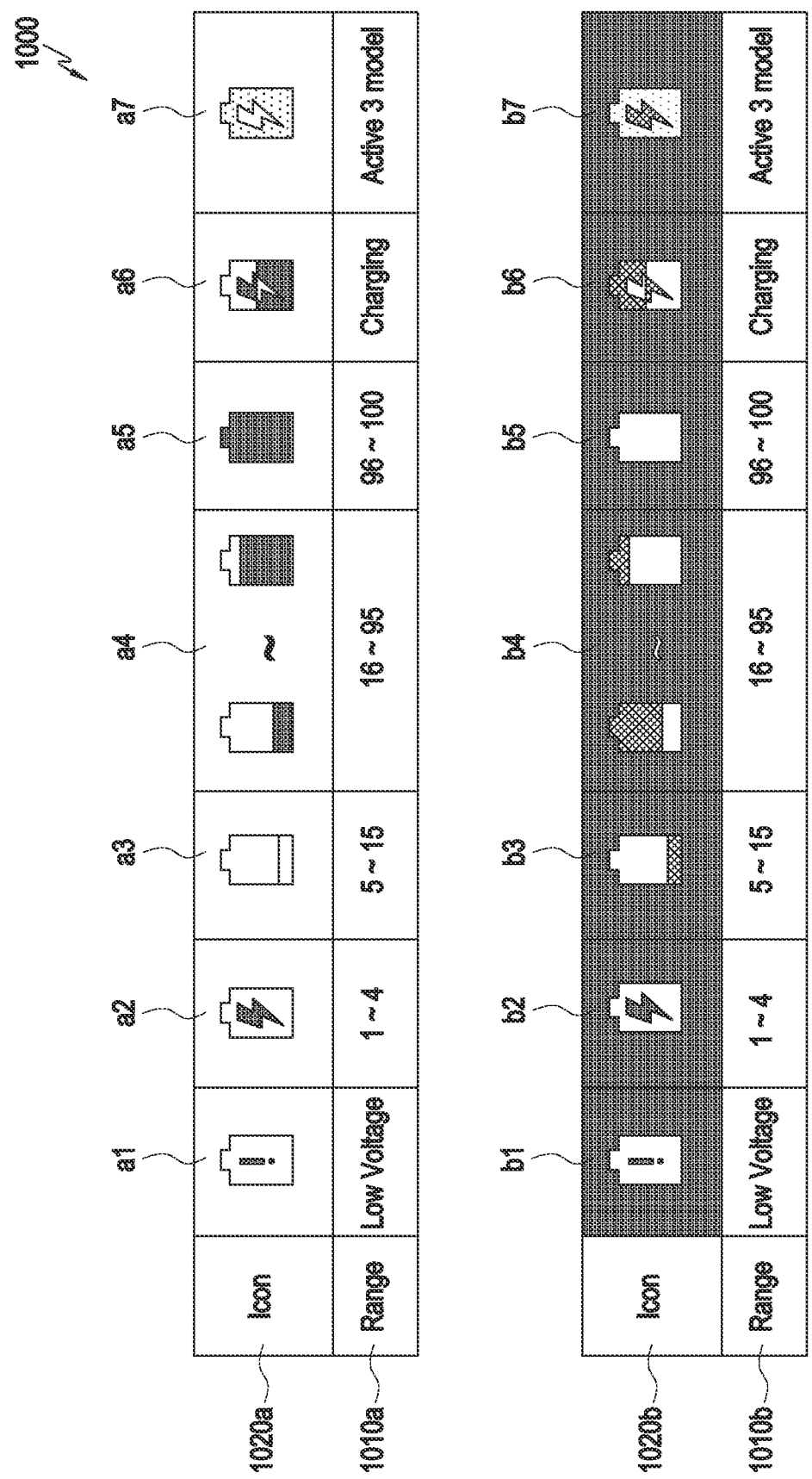
FIG. 10 is a diagram illustrating display of a capacity of a battery in an electronic device according to various embodiments.

FIG. 10 is a diagram 1000 illustrating display of a capacity of a battery in an electronic device according to various embodiments.

Removable batteries (e.g., the battery 450*a* of FIG. 4 and the battery 450*b* of FIG. 5) connected to an electronic device (e.g., the electronic device 101 of FIG. 1, the processor 120 of FIG. 1, the electronic device 201 of FIG. 2 to FIG. 5, or the processor 220 of FIG. 2 to FIG. 5) may be divided into various UIs according to the capacity of the batteries to be displayed on a display of the electronic device.

Referring to FIG. 10, when indicating the capacity of the battery connected to the electronic device by using a percentage (%), the electronic device may display, via UIs, corresponding icons 1020*a* a2 to a6 and b2 to b6 according to ranges 1010*a* and 1010*b* of percentage (%). If the battery connected to the electronic device is in a third state that is a low voltage state, the electronic device may display, via UIs, icons 1020*b* a1 and b1 corresponding to the low voltage state, and may display, when the range of a charged percentage (%) becomes "1" in the low voltage state, icons a2 and b2 corresponding to the range of the charged percentage (%) of 1-4. When displaying icons a2 and b2 corresponding to the range of the charged percentage (%) of 1-4, the electronic device may display a number or UI indicating the range of a charged percentage (%) according to a charging state of the battery. The electronic device may display, via UIs, icons a6 and b6 indicating that the battery connected to the electronic device is currently in a charging state, and may display, via UIs, icons a7 and b7 indicating that the electronic device is currently in a first state where power is received from an external electronic device without a battery connection.

According to various embodiments, a method for measuring a voltage of a battery in an electronic device may include, in a first state where an electronic device in which a battery is not connected to a battery connection circuit receives power from an external electronic device, identifying a connection of the battery to the battery connection circuit, measuring a voltage of the battery if the connection of the battery is identified, identifying a capacity of the battery, based on the measured voltage, and if the capacity of the battery is identified, performing switching to a second state where a charging circuit configured to supply power received from the external electronic device to the battery and a component of the electronic device supplies the power from the external electronic device to the battery connected to the control connection circuit.

According to various embodiments, the method may further include, when the first state is identified, controlling a switch of the charging circuit to be in an open state to prevent power from the external electronic device from being supplied to the battery connection circuit.

According to various embodiments, the method may further include, if the connection of the battery to the battery connection circuit is identified in the first state, controlling the switch of the charging circuit to be in the open state to prevent power from the external electronic device from being supplied to the battery connection circuit.

According to various embodiments, the method may further include, when the voltage or the capacity of the battery is identified, controlling the switch to be in the closed state to allow power from the external electronic device to be supplied to the battery.

According to various embodiments, the method may further include measuring the voltage of the battery if the connection of the battery to the battery connection circuit is identified in the first state, performing switching to a third state, where the battery receives power from the external electronic device, if the measured voltage of the battery is equal to or lower than a first threshold value, and displaying, via a UI, a low voltage of the battery in the third state.

According to various embodiments, the method may further include measuring the voltage of the battery if the connection of the battery to the battery connection circuit is identified in the first state, recognizing the battery as an abnormal battery if the measured voltage of the battery is equal to or higher than the first threshold value and the measured voltage of the battery is equal to or higher than a second threshold value, and displaying a warning message informing that an abnormal battery is connected.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a battery connection circuit;
   a charging circuit configured to supply power received from an external electronic device to one or more of a battery and a component of the electronic device;
   at least one processor; and
   memory storing instructions that, when executed by the at least one processor, cause the electronic device to:
   detect an establishment of a connection of the battery to the battery connection circuit;
   measure a voltage of the battery based on the detection of the connection;
   after a capacity of the battery is identified based on the measured voltage, perform switching to a state where the charging circuit supplies power from the external electronic device to the battery connected to the battery connection circuit,
   based on a determination that the measured voltage of the battery is equal to or lower than a first threshold value, display a low voltage of the battery via a user interface; and
   based on a determination that the measured voltage of the battery is equal to or higher than the first threshold value and the measured voltage of the battery is equal to or higher than a second threshold value which is higher than the first threshold value, display a warning message informing that an abnormal battery is connected.

2. The electronic device of claim 1, wherein the charging circuit comprises a switch, and
   wherein the instructions, when executed by the at least one processor, cause the electronic device to:
   based on a determination that the battery is not connected to the battery connection circuit, control the switch to be in an open state to prevent power from the external electronic device from being supplied to the battery connection circuit.

3. The electronic device of claim 1, wherein the charging circuit comprises a switch, and
   wherein the instructions, when executed by the at least one processor, cause the electronic device to:
   based on a determination that the battery is not connected to the battery connection circuit, control the switch to be in an open state to prevent power from the external electronic device from being supplied to the battery connection circuit, and
   based on a determination that one of the voltage of the battery and the capacity of the battery is identified, control the switch to be in a closed state to allow power from the external electronic device to be supplied to the battery.

4. The electronic device of claim 1, wherein the charging circuit comprises
   an external electronic device connector configured to receive a voltage of the electronic device,
   a voltage adjuster configured to adjust the voltage received from the external electronic device to a reference voltage set in the electronic device,
   a remaining battery amount measurer configured to measure the voltage of the battery connected to the electronic device and measure, based on the measured voltage, the capacity of the battery,
   a switch configured to supply the voltage of the external electronic device, which is received via the electronic device, to the battery connected to the electronic device, and
   a battery identification unit configured to be capable of recognizing the battery mounted in the electronic device.

5. A method for measuring a voltage of a battery in an electronic device, the method comprising:
   detecting an establishment of a connection of the battery to a battery connection circuit that receives power from an external electronic device;
   based on a determination that the connection of the battery is established, measuring a voltage of the battery and identifying, based on the measured voltage, a capacity of the battery;
   based on a determination that the capacity of the battery is identified, performing switching to a state where a charging circuit configured to supply power received from the external electronic device to the battery and a component of the electronic device supplies the power from the external electronic device to the battery connected to the battery connection circuit,
   based on a determination that the measured voltage of the battery is equal to or lower than a first threshold value, display a low voltage of the battery via a user interface;

and
based on a determination that the measured voltage of the battery is equal to or higher than the first threshold value and the measured voltage of the battery is equal to or higher than a second threshold value which is higher than the first threshold value, displaying a warning message informing that an abnormal battery is connected.

6. The method of claim 5, further comprising, based on a determination that the battery is not connected to the battery connection circuit, controlling a switch of the charging circuit to be in an open state to prevent power from the external electronic device from being supplied to the battery connection circuit.

7. The method of claim 5, further comprising:
based on a determination that the battery is not connected to the battery connection circuit, controlling a switch of the charging circuit to be in an open state to prevent power from the external electronic device from being supplied to the battery connection circuit; and
based on a determination that one of the voltage of the battery and the capacity of the battery is identified, controlling the switch to be in a closed state to allow power from the external electronic device to be supplied to the battery.

8. An electronic device comprising:
a battery connection circuit;
a charging circuit configured to supply power received from an external electronic device to one or more of a battery and a component of the electronic device;
a switch configured in one of an open state and a closed state in an electrical path between the charging circuit and the battery connection circuit; and
at least one processor; and
memory storing instructions that, when executed by the at least one processor, cause the electronic device to:
control the switch to be in the open state,
identify a connection of the battery to the battery connection circuit,
measure a voltage of the battery based on a determination that the connection of the battery is identified, and
control the switch to be in the closed state,
based on a determination that the measured voltage of the battery is equal to or lower than a first threshold value, display a low voltage of the battery via a user interface;
identify the battery as an abnormal battery based on a determination that the measured voltage of the battery is equal to or higher than the first threshold value and the measured voltage of the battery is equal to or higher than a second threshold value which is higher than the first threshold value, and
display a warning message informing that an abnormal battery is connected.

9. The electronic device of claim 8, wherein the instructions, when executed by the at least one processor, cause the electronic device to:
control the switch to be in the open state based on a determination that the battery is not connected to the battery connection circuit that is receiving power from the external electronic device.

10. The electronic device of claim 8, wherein the instructions, when executed by the at least one processor, cause the electronic device to:
control the switch to be in the closed state to allow power from the external electronic device to be supplied to the battery connected to the battery connection circuit.

* * * * *